United States Patent [19]
Mitome et al.

[11] Patent Number: 4,901,109
[45] Date of Patent: Feb. 13, 1990

[54] ALIGNMENT AND EXPOSURE APPARATUS

[75] Inventors: Noriyuki Mitome, Yokohama; Hideki Ina, Kawasaki, both of Japan

[73] Assignee: Canon Kabushiki Kaisha, Tokyo, Japan

[21] Appl. No.: 358,505

[22] Filed: May 30, 1989

Related U.S. Application Data

[63] Continuation of Ser. No. 22,020, Mar. 5, 1987, abandoned.

[30] Foreign Application Priority Data

Mar. 10, 1986 [JP]  Japan ................................ 61-050504

[51] Int. Cl.⁴ ...................... G03B 27/42; G03B 27/74; G03B 27/80
[52] U.S. Cl. ......................................... 355/68; 355/53
[58] Field of Search .................................... 355/68, 53

[56] References Cited

U.S. PATENT DOCUMENTS 3,865,483  2/1975  Wojcik ................................. 355/53
4,355,892  10/1982  Mayer et al. .......................... 355/77
4,437,758  3/1984  Suzuki .................................. 355/53

FOREIGN PATENT DOCUMENTS 60-249325  12/1985  Japan .

Primary Examiner—Monroe H. Hayes
Attorney, Agent, or Firm—Fitzpatrick, Cella, Harper & Scinto

[57] ABSTRACT

An alignment and exposure apparatus for aligning an original such as a reticle and a workpiece such as a wafer and for photolithographically transferring a pattern of the original onto the workpiece. The alignment of the original and the workpiece is achieved by detecting diffractively scattered light from alignment marks of the original and the workpiece. For this alignment, plural and different wavelengths are used. One of the wavelengths which is close to an exposure wavelength is used to detect both the original and the workpiece. Another wavelength is used to detect only the workpiece. By this, high-accuracy alignment of the original and the workpiece is ensured.

6 Claims, 2 Drawing Sheets

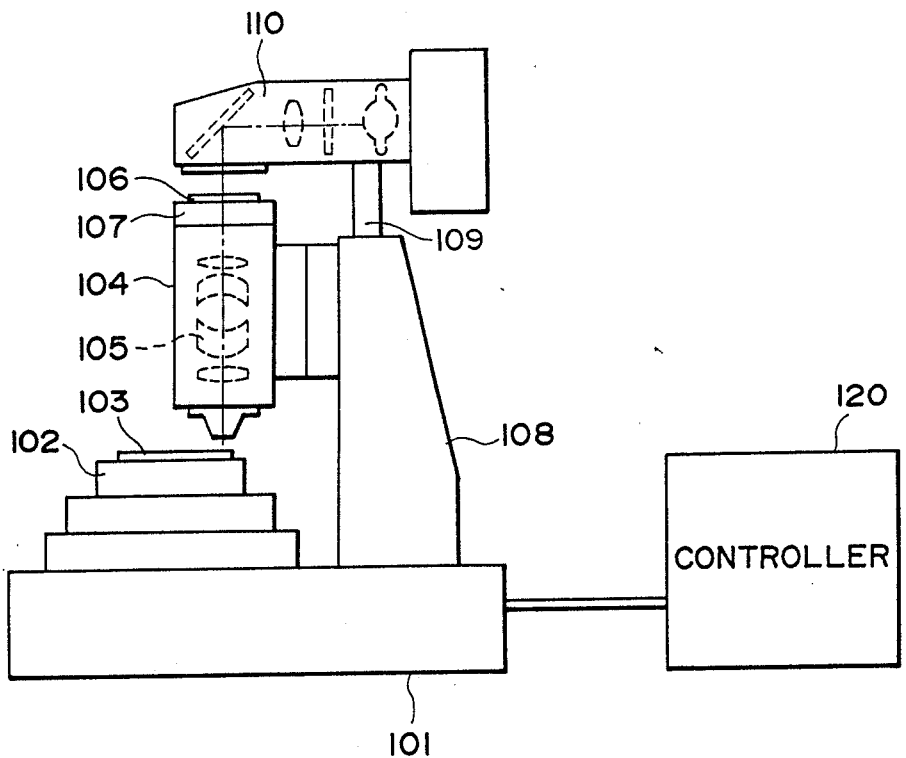
F I G. 1

ALIGNMENT AND EXPOSURE APPARATUS

This application is a continuation division, of application Ser. No. 022,020 filed Mar. 5, 1987, now abandoned.

FIELD OF THE INVENTION AND RELATED ART

This invention relates to an alignment and exposure apparatus usable in a photolithographic process. More particularly, the invention is concerned with such alignment and exposure apparatus for accurately transferring a pattern formed on an original, such as a reticle, onto a workpiece such as a semiconductor wafer, without an alignment error.

In the field of manufacture of semiconductor devices such as integrated circuits, step-and-repeat type exposure apparatuses, called "steppers", have been developed and used. The development of such step-and-repeat type exposure apparatuses has ensured high-accuracy alignment of a reticle and a wafer. Various types of alignment systems are employed in the step-and-repeat type exposure apparatuses. Of these alignment systems, a TTL (through the lens) alignment system has an inherent ability of high-accuracy alignment because, according to this alignment system, the state of alignment of the reticle and the wafer can be directly observed through a projection lens system that is used to project an image of the reticle upon the wafer.

An example of such TTL alignment system has been proposed in Japanese Laid-Open Pat. Application, Laid-Open No. 25638/1983 filed in the name of the assignee of the subject application. The proposed alignment system is designed to be used with a projection optical system that is aberration-corrected with respect to a g-line (436 nm) which is an exposure wavelength used in the photoprinting. The alignment system includes an He-Cd laser for producing an alignment beam of a wavelength 441.6 nm which is close to the wavelength of the g-line, in order to minimize the effect of aberrations of the projection optical system that appears on the reticle or the wafer.

Alignment marks formed on the reticle can be detected relatively easily and stably, because these reticle alignment marks are usually provided by steps (recesses or protrusions) defined at the boundary between a glass substrate and a chromium material or a chromium oxide material applied to the glass substrate. Because of such simple structure, stable alignment mark signals are obtainable on the basis of diffractively scattered light from the reticle alignment marks. As for wafer alignment marks, on the other hand, signals of diffractively scattered light from the wafer alignment marks, provided by steps formed on the wafer, are often unstable due to unevenness of a resist coating applied to the wafer and/or irregularity of the steps forming the wafer alignment marks. Because of such unstableness, there is a possibility of deterioration of the alignment accuracy, particularly with respect to the wafer alignment marks. Further, where a multi-layered photoresist coating is provided on the wafer in an attempt to improve the absorption of light of the g-line used as the exposure wavelength, there is a high possibility that signals representing the wafer alignment marks can not be detected sufficiently.

SUMMARY OF THE INVENTION

It is accordingly a primary object of the present invention to provide an alignment and exposure apparatus by which an image of a pattern of an original, such as a reticle, can be accurately and exactly projected upon a predetermined or desired position on a workpiece such as a semiconductor wafer.

To achieve this object, in one preferred form of the present invention which will be described later, plural and different wavelengths are used as an alignment beam for the detection of alignment marks.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic and diagrammatic view of an alignment and exposure apparatus according to an embodiment of the present invention.

DESCRIPTION OF THE PREFERRED EMBODIMENTS

Figure 2:
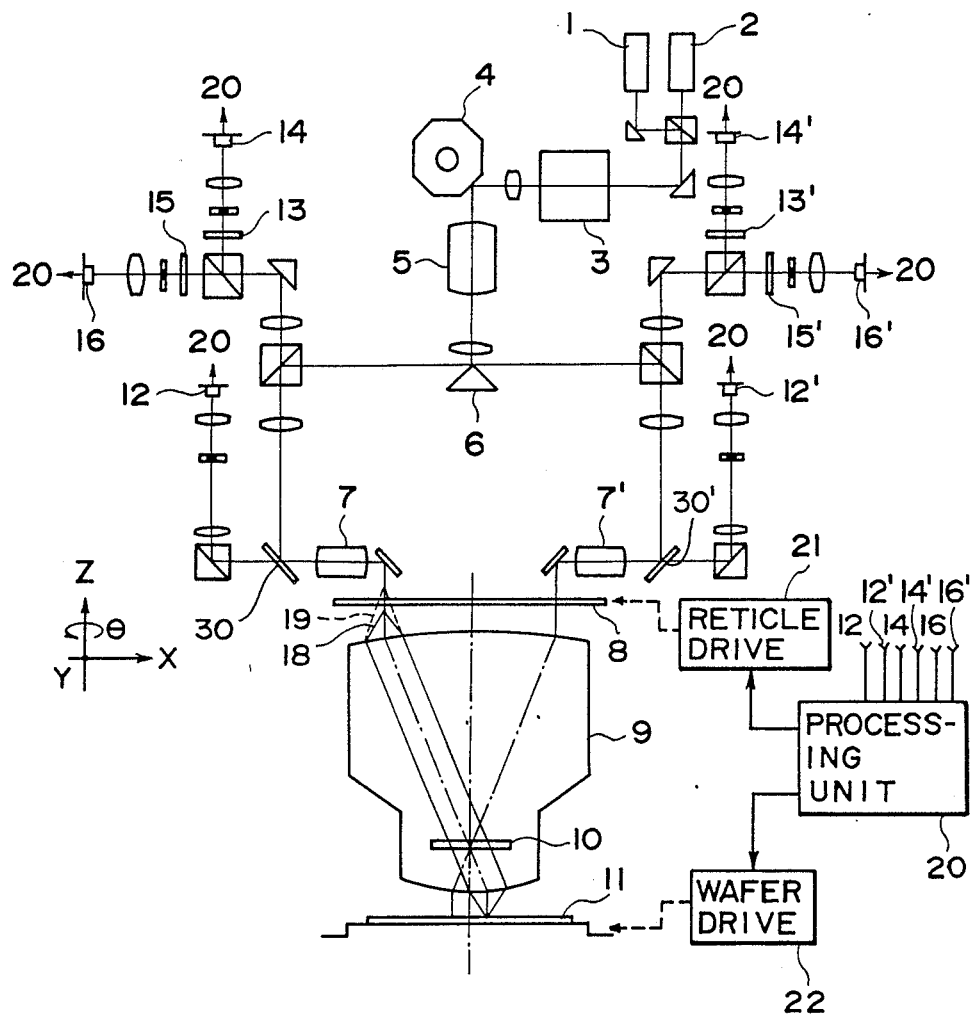
FIG. 2 is a schematic and diagrammatic view of an alignment system employed in the apparatus of FIG. 1.

Referring first to FIG. 1, there is shown an alignment and exposure apparatus according to one embodiment of the present invention. As shown, the apparatus includes a base member 101 on which an X-Y stage 102 is placed. By a suitable mechanism of known type, the X-Y stage 102 is made movable as desired in a plane. A wafer 103 having a photosensitive surface layer is held on the X-Y stage 102 by means of a wafer chuck, not shown. The apparatus further includes a barrel 104 that accommodates a projection lens system 105 of the reduction projection type. A photomask or reticle 106 has a pattern, for the manufacture of semiconductor circuit devices, formed on its lower surface and is held on a reticle stage (mask stage) 107 disposed above the barrel 104.

The alignment and exposure apparatus further includes an illumination unit 110 which is fixedly mounted on an upper portion of a post 108 by means of a connecting post 109. The illumination unit 110 comprises a light source, shutter means, a condenser lens, an optical-path deflecting mirror and filter means, which are cooperative with each other to irradiate the reticle 106 with light of a predetermined exposure wavelength. In response to this irradiation, the photosensitive layer of the wafer 103 is exposed to the light passed through the reticle 106, such that the image of the pattern of the reticle 106 is transferred onto the wafer 103 by way of the projection lens system 105. In other words, the reticle 106 pattern is photoprinted on the wafer 103. Depicted diagrammatically at 120 is a controller which is provided to control the alignment and exposure apparatus. The controller 120 is arranged to control the alignment operation which will be described later and, additionally, the exposure operation using the illumination unit 110, stepwise movement of the X-Y stage 102 for the step-and-repeat exposures and so on.

FIG. 2 shows details of the alignment system employed in the alignment and exposure apparatus of the FIG. 1 embodiment. Particularly, FIG. 2 depicts an imaging relation of the elements with respect to the alignment beam that is provided by plural and different wavelengths, as well as details of the arrangement of signal detecting systems.

In FIG. 2, the alignment system of the present embodiment includes two lasers 1 and 2. In this embodiment, the first laser 1 comprises an He-Ne laser that produces light of a wavelength 632.8 nm. On the other hand, the second laser 2 comprises an He-Cd laser that produces light of a wavelength 441.6 nm. Denoted by numeral 3 is a sheet-like beam forming optical system comprising plural cylindrical lens elements; by 4, a polygonal mirror which is rotatable at a constant speed so as to scanningly deflect, alternately or simultaneously, the laser beams from the first and second lasers 1 and 2, respectively; by 5, an f−θ lens; by 6, a roof prism effective to define first and second halves of the beam scanning region; by 7 and 7', objective lenses for projecting the laser beams upon a reticle 8 (corresponding to the reticle 106 in FIG. 1) on which one or more circuit patterns for the manufacture of semiconductor circuit devices and one or more alignment marks are formed in a predetermined positional relation; by 9, a reduction projection lens system (corresponding to the projection lens system 105 in FIG. 1) whose aberrations have been corrected with respect to the g-line; and by 10, a quarter waveplate included in the projection lens system 9. A workpiece 11 which, in this embodiment, is a wafer corresponding to the wafer 103 in FIG. 1 has an upper surface coated with a resist material. Also, plural shot areas are defined on the wafer 11 surface, in each of which regions one or more alignment marks are formed.

The alignment system further includes detectors 12 and 12' provided to detect, with the aid of the objective lenses 7 and 7', reticle alignment mark signals (hereinafter "reticle signals") formed by light diffractively scattered by the alignment marks of the reticle 8. Sharp-cut filters 13 and 13' are provided to intercept light of a wavelength or wavelengths longer than 441.6 nm. The alignment system further includes first wafer-signal detectors 14 and 14' which are effective to detect, with the aid of the objective lenses 7 and 7' and under the influence of the sharp-cut filters 13 and 13', only wafer alignment mark signals (hereinafter "wafer signals") formed by light of 441.6 nm diffractively scattered from the alignment marks of the wafer 11, caused in response to irradiation of the wafer alignment marks with the laser beam from the second laser 2 that comprises the He-Cd laser in this embodiment.

Sharp-cut filters 15 and 15' are provided to intercept light of a wavelength or wavelengths shorter than 632.8 nm. Second wafer-signal detectors 16 and 16' are provided, which are effective to detect, with the aid of the objective lenses 7 and 7' and under the influence of the sharp-cut filters 15 and 15', only the wafer signals formed by light of 632.8 nm wavelength diffractively scattered from the alignment marks of the wafer 11, caused in response to irradiation of the wafer alignment marks with the laser beam from the first laser 1 that comprises the He-Ne laser in this embodiment.

Solid lines denoted at 18 in FIG. 2 depict the state of imaging or focusing that is established with respect to the wavelength 441.6 nm. On the other hand, broken lines denoted at 19 depict the state of imaging or focusing that is established with respect to the wavelength 632.8 nm.

A processing unit 20 is included in the controller 120 shown in FIG. 1 and is provided to compute positional deviation of the reticle 8 and the wafer 11 in each of X, Y and θ directions on the basis of outputs of the detectors 12, 12', 14, 14', 16 and 16'. In accordance with the result of computation at the processing unit 20, a reticle driving system 21 and a wafer driving system 22 are operated as required, so as to move at least one of the reticle 8 and the wafer 11 in the X, Y and θ directions to thereby bring the reticle 8 and the wafer 11 into alignment.

The optical components of the alignment system of the present embodiment are arranged such that both the alignment beam of the wavelength 441.6 nm from the He-Cd laser 2 and the alignment beam of the wavelength 632.8 nm from the He-Ne laser 1 are focused on the wafer 11 surface. This leads to the result that, due to the chromatic aberration of the projection lens system 9, the aberrations of which have been corrected with respect to the g-line, the alignment beam of the wavelength 632.8 nm is not focused upon the reticle 8. In view of this result, according to the alignment system of the present embodiment, the wafer alignment marks are detected by use of two wavelengths while, on the other hand, the reticle alignment marks are detected by use of one of the two wavelengths.

The quarter waveplate 10 has been designed for use with the wavelength 441.6 nm of the laser beam from the second, He-Cd laser 2. Namely, the quarter waveplate 10 is used to produce a difference between the linearly-polarized component of the light that bears information concerning the reticle alignment mark and the linearly-polarized component of the light that bears information concerning the wafer alignment mark, thereby to allow separation of the reticle signals and the wafer signals and thereby to assure that good reticle signals are stably attainable at the detectors 12 and 12'. More specifically, the second laser 2 used is a linear polarization type, so that the direction of polarization of the light forming the reticle signal (i.e. the light directly reflected from the reticle 8) differs, by 90 degrees, from the direction of polarization of the light forming the wafer signal (i.e. the light passed twice through the quarter waveplate 10). Such reticle signal light and wafer signal light, having different polarization directions, are separated by means of a polarization beam splitter 30 or 30', such that they are detected independently. While not shown in the drawings, sharp-cut filters similar to the sharp-cut filters 13 and 13' are disposed behind the beam splitters 30 and 30', respectively, so as to prevent the reticle signal light and the wafer signal light, caused in response to irradiation with the He-Ne laser, from reaching the detectors 12 and 12'.

As for the detection of wafer signals, two kinds of wafer signals corresponding to the two wavelengths are detected at the detectors 14 (14') and 16 (16') independently of each other, under the influence of the sharp-cut filters 13 (13') and 15 (15'). Thus, weighting in regard to the two wavelengths can of course be controlled.

The processing unit 20 calculates the positional deviation of the reticle 8 and the wafer 11 in each of the X, Y and θ directions, by use of a set of output signals from the detectors 12, 12', 14 and 14' and/or a set of output signals from the detectors 12, 12', 16 and 16'. In accordance with the positional deviation detected on the basis of one of the two sets of output signals or, alternatively, in accordance with a value that is obtained by weighting, with a predetermined proportion, the deviations calculated respectively on the basis of the two sets of output signals and, then, by averaging the weighted deviations, the processing unit 20 controls the reticle driving system 21 and the wafer driving system 22 so as to avoid, reduce or eliminate the detected positional deviation. It is, of course, possible to process the wafer signals from the detectors 14, 14', 16 and 16' in such manner that, in each of a set of the detectors 14 and 16 and a set of the detectors 14' and 16', two kinds of output signals corresponding to the two wavelengths used are weighted with a predetermined proportion and then the output signals having been weighted are added to each other. After this, they are used with the output signals from the detectors 12 and 12', detecting the reticle signals, in the calculation of the positional deviation in each of the X, Y and $\theta$ directions.

In accordance with the present embodiment, as described, the wafer alignment marks can be detected by use of two wavelengths as desired. Therefore, it is possible to provide measurement averaging effect against the influence, upon alignment mark signals, of the irregularity of the steps forming the alignment marks or the unevenness of the resist layer formed on the wafer. Consequently, with the present embodiment, stable wafer signals are always obtainable, with the result that the alignment accuracy can be improved significantly. Further, high-accuracy alignment is attainable where a multi-layered resist coating is provided on the wafer.

It will be readily understood from the foregoing that, in accordance with the present invention, the alignment system can be arranged so that the reticle alignment marks are detected by use of an alignment beam having a wavelength close to the exposure wavelength while, on the other hand, the wafer alignment marks are detected by use of an alignment beam having a similar wavelength and/or an alignment beam having a wavelength significantly different from the exposure wavelength. The selection of the alignment beams for the wafer alignment mark detection is made as desired, in accordance with the wafer which is going to be subjected to the mark detection.

In the embodiment described with reference to FIG. 2, two lasers are used. It is therefore necessary to adjust these lasers so that, with respect to the incidence of the laser beams from the two lasers upon the wafer, the centers of these laser beams (or chief rays thereof) are coincident with each other. If the adjustment is not made, there occurs a timing error in the generation of wafer signals in the course of the detection of the wafer alignment marks using the two laser beams. One way to solve such problem is to use a standard wafer on which reference alignment marks of desired shape or structure are formed. The two lasers are separately or sequentially used to scan each reference alignment mark of the standard wafer by use of the two laser beams, individually. In response to the scan of the alignment marks with each laser beam, only the wafer alignment mark signals are detected. By doing so, the timing error of the wafer signals, described above can be detected. From the thus detected timing error, the amount of offset due to the misalignment of the centers or axes of the two laser beams can be detected by calculation, such that the adjustment error of the two lasers can be corrected. At the time of such correcting adjustment, one of the laser beams that has a wavelength equal to or close to the exposure wavelength may be used as a reference. Where the projection lens system used is of the type wherein the aberrations are corrected with respect to the g-line, as in the case of the FIG. 2 embodiment, the laser beam from the He-Cd laser having a wavelength 441.6 nm is used as such reference.

In accordance with the present invention, as described hereinbefore, stable wafer signals are attainable owing to the wavelength-averaging effect. That is, with the present invention, improved alignment accuracy is attainable regardless of any irregularity of the steps forming the alignment marks and any unevenness in the resist layer provided on the wafer, which are liable to cause, without the present invention, unstable wafer signals that degrade the alignment accuracy.

In the foregoing explanation, the invention has been described with reference to an alignment system that is used in an exposure apparatus having a reduction projection optical system adapted to be used with an exposure beam of the g-line. However, the invention is not limited to such embodiment, and is applicable also to a case where the projection optical system is designed so that its aberrations are corrected with respect to an i-line, for the purpose of assuring higher resolution. For example, where a laser of the multi-wavelength oscillation type such as an Ar laser is used, both the reticle signals and the wafer signals are attainable with a wavelength of 363.8 nm which is close to the i-line (365 nm) while, on the other hand, only the wafer signals are obtainable with a the wavelength of 351.4 nm. In such case, the optical components of the alignment system are designed so that the aberrations are corrected with respect to such two wavelengths. In this type of alignment system, only a single laser is necessary, which avoids the necessity of axis adjustment of the two lasers as described hereinbefore. Also, the measurement of the offset with respect to the two wavelengths, described in the foregoing, is not necessary. In place of using the wavelength of 351.4 nm, another wavelength of such as a wavelength 488 nm or 514.5 nm, that can be emitted from the Ar laser, may of course be used.

While the invention has been described with reference to the structures disclosed herein, it is not confined to the details set forth and this application is intended to cover such modifications or changes as many come within the purposes of the improvements or the scope of the following claims.

What is claimed is:

1. A projection exposure apparatus for projecting a pattern of an original having an alignment mark on a workpiece having an alignment mark, said exposure apparatus comprising:

a first stage for supporting the original;
a second stage for supporting the workpiece;
an illumination system for illuminating the original with light having a predetermined wavelength;
a projection lens system for projecting the pattern of the original illuminated by said illumination system on the workpiece;
an alignment mark illuminating arrangement for providing a first light of a first wavelength, substantially the same as the predetermined wavelength, and a second light of a second wavelength different from the first wavelength, said illuminating arrangement being adapted to direct the first and second lights toward the original and the workpiece so that the first light is focused on the original while the second light is not focused on the original and such that both the first and second lights are focused on the workpiece through said projection lens system, and said illuminating arrangement including means for scanning the first and second lights so that the alignment marks of the original and the workpiece are scanned with the first and second lights;

converting means for receiving diffracted light components from the alignment marks of the original and the workpiece, scanned with the first and second lights, and for photoelectrically converting the received light components into electric signals; and adjusting means for adjusting a positional relationship between the original and the workpiece on the basis of the signals from said converting means.

2. An apparatus according to claim 1, wherein said converting means comprises first light receiving means for selectively receiving the diffracted light component from the alignment mark of the original, produced in response to the irradiation of the same with the first light, and second light receiving means for selectively receiving the diffracted light component from the alignment mark of the workpiece, produced in response to the irradiation of the same with the first and second lights, and wherein said adjusting means is operable in response to a first signal from said second light receiving means to adjust the positional relationship between the original and the workpiece.

3. An apparatus according to claim 2, wherein said second light receiving means comprises a first photodetector for selectively receiving a diffracted light component produced in response to the irradiation by the first light, and a second photodetector for selectively receiving a diffracted light component produced in response to the irradiation by the second light.

4. An apparatus according to claim 1, wherein said illuminating arrangement comprises a laser device adapted to emit a laser beam having the first and second wavelengths.

5. An apparatus according to claim 1, wherein said illuminating arrangement comprises a first laser device adapted to emit a laser beam having the first wavelength and a second laser device adapted to emit a laser beam having the second wavelength.

6. An apparatus according to claim 1, wherein said scanning means includes a deflector disposed on a path of the first and second lights.

* * * * *

UNITED STATES PATENT AND TRADEMARK OFFICE
CERTIFICATE OF CORRECTION

PATENT NO. : 4,901,109

DATED : February 13, 1990

INVENTOR(S) : Noriyuki Mitome, et al.

It is certified that error appears in the above-identified patent and that said Letters Patent is hereby corrected as shown below:

COLUMN 1

Line 4, "division," should be deleted.

COLUMN 5

Line 2, "avoid," should be deleted.
Line 44, "coincident," should read --coincident--.

COLUMN 6

Line 33, "of" should be deleted. (2nd Occur.)
Line 34, "wavelength" should read --wavelength of--.

Signed and Sealed this

Tenth Day of September, 1991

Attest:

HARRY F. MANBECK, JR.

Attesting Officer

Commissioner of Patents and Trademarks